(12) United States Patent
Nakajima et al.

(10) Patent No.: US 9,843,019 B2
(45) Date of Patent: Dec. 12, 2017

(54) LIGHT EMITTING APPARATUS

(71) Applicant: PIONEER OLED LIGHTING DEVICES CORPORATION, Kawasaki-shi, Kanagawa (JP)

(72) Inventors: Shinji Nakajima, Yonezawa (JP); Koji Fujita, Yonezawa (JP); Shinsuke Tanaka, Yonezawa (JP); Yuji Saito, Yonezawa (JP)

(73) Assignee: PIONEER OLED LIGHTING DEVICES CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/113,422

(22) PCT Filed: Jan. 24, 2014

(86) PCT No.: PCT/JP2014/051466
§ 371 (c)(1),
(2) Date: Jul. 22, 2016

(87) PCT Pub. No.: WO2015/111181
PCT Pub. Date: Jul. 30, 2015

(65) Prior Publication Data
US 2017/0012240 A1    Jan. 12, 2017

(51) Int. Cl.
*H01L 51/52* (2006.01)
*H01L 27/32* (2006.01)

(52) U.S. Cl.
CPC ...... *H01L 51/5253* (2013.01); *H01L 27/3276* (2013.01); *H01L 51/5203* (2013.01);
(Continued)

(58) Field of Classification Search
CPC ............ H01L 51/5203; H01L 51/5206; H01L 51/5221; H01L 51/52; H01L 27/3276; H01L 51/5253; H01L 2251/5361
See application file for complete search history.

(56) References Cited

U.S. PATENT DOCUMENTS 7,733,441 B2   6/2010   Seo et al.
8,137,148 B2   3/2012   Farquhar et al.
(Continued)

FOREIGN PATENT DOCUMENTS

JP   2007-264583   10/2007
JP   2013-016816    1/2013
JP   2013-506958    2/2013

OTHER PUBLICATIONS

International Search Report for PCT App No. PCT/JP2014/051466 dated Apr. 8, 2014, 4 pgs.

*Primary Examiner* — Thanh T Nguyen
(74) *Attorney, Agent, or Firm* — Procopio, Cory, Hargreaves & Savitch LLP

(57) ABSTRACT

An organic EL element (102) is formed on a substrate (100), and an insulating layer (120) surrounds the organic EL element (102). A conductive layer (300) is located between the substrate (100) and the insulating layer (120) in a thickness direction, and is across an edge (126) of the insulating layer (120) opposite the organic EL element (102). The conductive layer (300) includes a first layer (310) and a second layer (320). The second layer (320) is formed on the first layer (310). The conductive layer (300) does not include a portion of the second layer (320) in a portion overlapped with the edge (126) of the insulating layer (120).

5 Claims, 17 Drawing Sheets

(52) U.S. Cl.
CPC ...... *H01L 51/5206* (2013.01); *H01L 51/5221* (2013.01); *H01L 2251/5361* (2013.01)

(56) References Cited

U.S. PATENT DOCUMENTS

| | | |
|---|---|---|
| 8,582,058 B2 | 11/2013 | Seo et al. |
| 8,847,479 B2 | 9/2014 | Seo et al. |
| 9,099,668 B2 | 8/2015 | Seo et al. |
| 2005/0270464 A1 | 12/2005 | Seo et al. |
| 2010/0025716 A1 | 2/2010 | Seo et al. |
| 2010/0026179 A1 | 2/2010 | Seo et al. |
| 2011/0074281 A1 | 3/2011 | Farquhar et al. |
| 2012/0007057 A1* | 1/2012 | Choi ................ H01L 27/3246 257/40 |
| 2014/0374782 A1 | 12/2014 | Seo et al. |

\* cited by examiner

US 9,843,019 B2

LIGHT EMITTING APPARATUS

CROSS-REFERENCE TO RELATED APPLICATIONS

This application is a U.S. National Stage entry of PCT Application No. PCT/JP2014/051466, filed on Jan. 21, 2014, the contents of which are incorporated by reference.

TECHNICAL FIELD

The present invention relates to a light emitting apparatus.

BACKGROUND ART

In recent years, organic EL elements have been used in a light source of a light emitting apparatus. The organic EL element has a configuration with an organic layer interposed between two electrodes. These two electrodes are connected to a terminal through an interconnect.

Meanwhile, the light emitting apparatus is provided with an insulating layer in order to define the range of the organic EL element. This insulating layer surrounds the periphery of the organic EL element. An interconnect which is connected to the organic EL element extends between this insulating layer and a substrate when seen in a thickness direction (see, for example, Patent Document 1).

RELATED DOCUMENT

Patent Document

[Patent Document 1] Japanese Unexamined Patent Application Publication No. 2007-264583

SUMMARY OF THE INVENTION

In the above-described insulating layer, an opening is formed in a region to be formed as the organic EL element using, for example, a chemical solution. On the other hand, as described above, a conductive layer such as an interconnect may be formed at a position across the edge of this insulating layer. In a case where this conductive layer is formed of a two-layer structure, a chemical solution may infiltrate from the interface between the insulating layer and the conductive layer, causing an upper layer of the conductive layer which is covered with the edge of the insulating layer to become removed. In this case, the edge of the insulating layer becomes overhung and thus may break. If the edge of the insulating layer is broken, a defect may occur in a light emitting apparatus due to this edge.

The exemplified problem to be solved by the present invention is to prevent an edge of an insulating layer surrounding an organic EL element from being broken.

According to the invention of claim 1, there is provided a light emitting apparatus including: a substrate; an organic EL element formed on the substrate; an insulating layer that surrounds the organic EL element; and a conductive layer located between the substrate and the insulating layer and is across an edge of the insulating layer opposite the organic EL element, wherein the conductive layer includes a first layer and a second layer formed over the first layer, and the conductive layer does not include a portion of the second layer in a portion overlapped with the edge of the insulating layer opposite the organic EL element.

BRIEF DESCRIPTION OF THE DRAWINGS

The above and other objects, features and advantages will be made clearer from certain preferred embodiment described below, and the following accompanying drawings.

DESCRIPTION OF EMBODIMENTS

Figure 1:
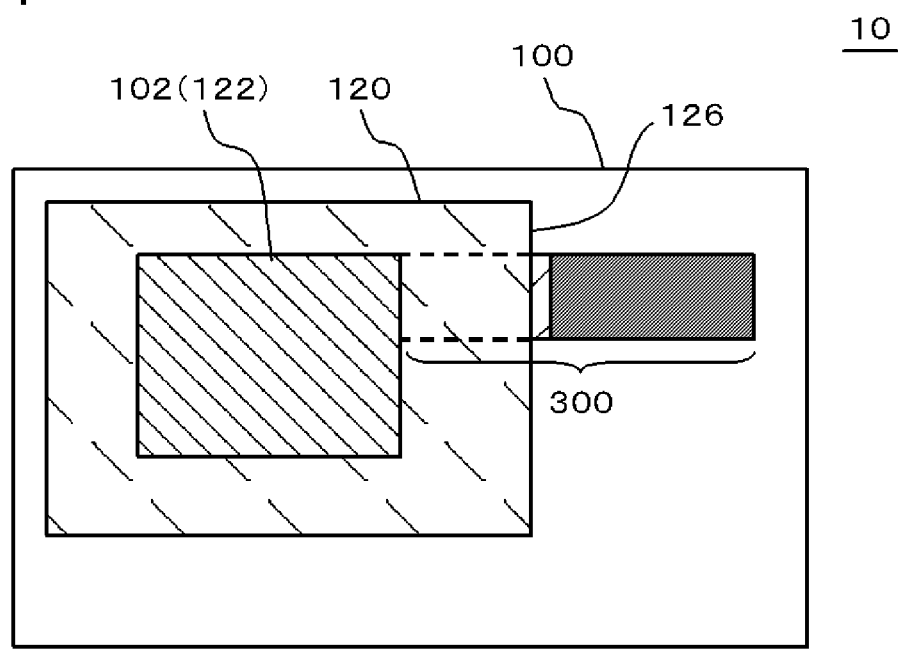
FIG. 1 is a plan view illustrating a configuration of a light emitting apparatus according to an embodiment.

Hereinafter, an embodiment of the present invention will be described with reference to the accompanying drawings. In all the drawings, like elements are referenced by like reference numerals and the descriptions thereof will not be repeated.

Figure 2:
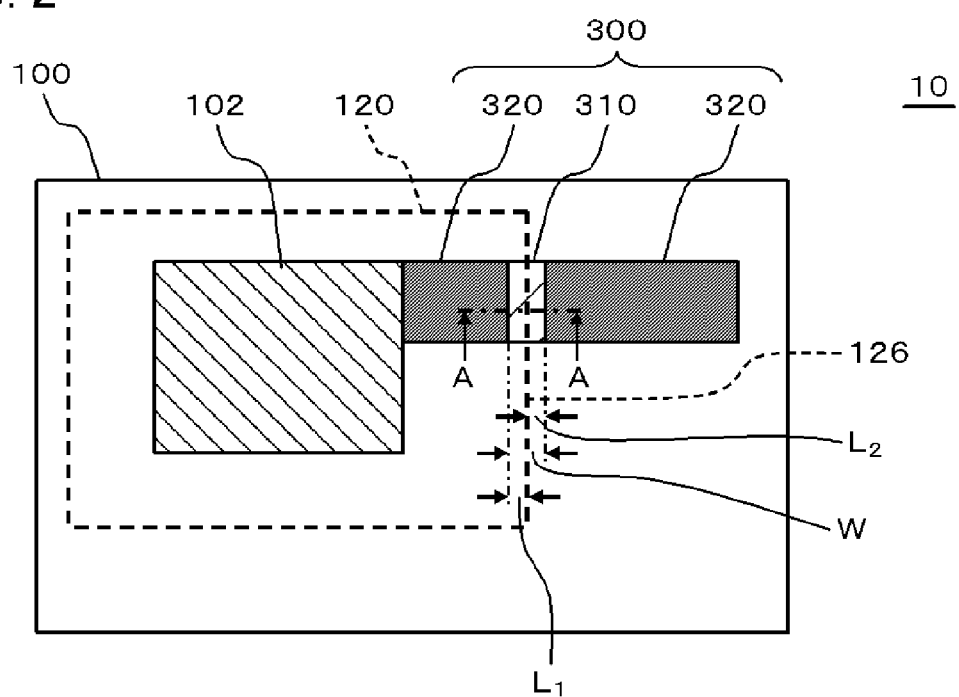
FIG. 2 is a diagram in which an insulating layer is removed from FIG. 1.
Figure 3:
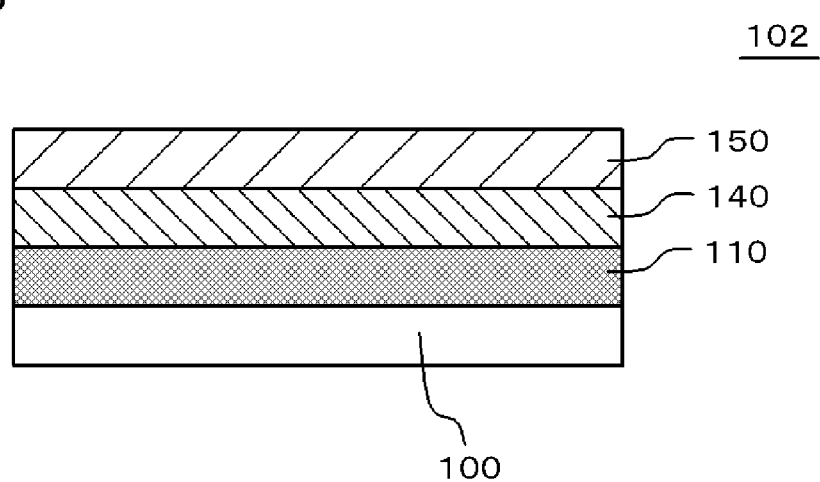
FIG. 3 is a cross-sectional view illustrating a configuration of an organic EL element.

FIG. 1 is a plan view illustrating a configuration of a light emitting apparatus 10 according to an embodiment. FIG. 2 is a diagram in which an insulating layer 120 is removed from FIG. 1. FIG. 3 is a cross-sectional view illustrating a configuration of an organic EL element 102. The light emitting apparatus 10 according to the embodiment includes a substrate 100, an organic EL element 102, an insulating layer 120, and a conductive layer 300. The organic EL element 102 is formed on the substrate 100, and the insulating layer 120 surrounds the organic EL element 102. The conductive layer 300 is located between the substrate 100 and the insulating layer 120 in a thickness direction, and is across an edge 126 of the insulating layer 120 opposite the organic EL element 102. The conductive layer 300 includes a first layer 310 and a second layer 320. The second layer 320 is formed on the first layer 310. The conductive layer 300 does not include a portion of the second layer 320 in a portion overlapped with the edge 126 of the insulating layer 120. The light emitting apparatus 10 is, for example, a display, but may be an illumination device. Hereinafter, a detailed description will be given.

The substrate 100 is a transparent substrate such as, for example, a glass substrate or a resin substrate. The substrate 100 may have flexibility. In this case, the thickness of the substrate 100 is, for example, equal to or greater than 10 μm and equal to equal to or less than 1,000 μm. In this case, the substrate 100 may be formed of any of an inorganic material and an organic material. The substrate 100 is polygonal such as, for example, rectangular.

As shown in FIG. 3, the organic EL element 102 has a configuration with an organic layer 140 interposed between a first electrode 110 and a second electrode 150. The organic layer 140 has a configuration in which a hole transport layer, a light emitting layer, and an electron transport layer are laminated in this order. In a case where the first electrode 110 is an anode, the hole transport layer is formed on the first electrode 110. In addition, in a case where the first electrode 110 is a cathode, the electron transport layer is formed on the first electrode 110.

At least one of the first electrode 110 and the second electrode 150 is configured as a light-transmitting electrode. In addition, the remaining electrode is formed of a metal such as, for example, Al or Ag. The light-transmitting electrode is a mesh-like electrode using, for example, a material of an inorganic material such as an indium tin oxide (ITO) or an indium zinc oxide (IZO), a conductive polymer such as a polythiophene derivative, or a nanowire made of silver or carbon. In the example shown in FIG. 3, in a case of a bottom-emission type organic EL element 102, the first electrode 110 is configured as a light-transmitting electrode, and the second electrode 150 is configured as an electrode of Al or the like which reflects light. In addition, in a case where a top-emission type organic EL element 102 has a configuration in which the first electrode 110, the organic layer 140, and the second electrode 150 are laminated on the substrate 100 in this order, the first electrode 110 is configured as an electrode of Al or the like which reflects light, and the second electrode 150 is configured as a light-transmitting electrode. In addition, a light-transmitting type light emitting apparatus may be configured using both the electrodes (first electrode 110 and second electrode 150) as light-transmitting electrodes (dual-emission type).

The insulating layer 120 is formed of a photosensitive resin such as a polyimide-based resin, and is formed in a desired pattern by exposure and development. As the insulating layer 120, for example, a positive-type photosensitive resin is used. Meanwhile, the insulating layer 120 may be resins other than a polyimide-based resin, for example, an epoxy-based resin or an acrylic-based resin.

The conductive layer 300 has a configuration in which the second layer 320 is laminated on the first layer 310. The conductive layer 300 is, for example, an interconnect which is connected to the organic EL element 102, but may be a dummy conductive pattern or an alignment mark. The first layer 310 is formed of, for example, the same material as that of an electrode of the two electrodes included in the organic EL element 102, which is located on the substrate 100 side (for example, a light-transmitting conductive material). The second layer 320 is formed of a material (metal such as, for example, Al) having a lower resistance than that of the first layer 310. Meanwhile, the second layer 320 may have a multi-layered structure.

Here, in an interconnect of the organic EL element 102, it is often the case that an ITO is used as the first layer 310, and that aluminum is used as the second layer 320. Particularly, the second layer often has a laminated structure of MoNb/AlNd/MoNb adopted therein. This reason is as follows.

First, in a case where aluminum and an ITO are brought into direct contact with each other, the chemical resistance of the ITO is weakened due to an electrochemical effect. In addition, the electrical contact between aluminum and an ITO is inferior, and the contact resistance therebetween is temporally degraded. In order to avoid these problems, it is preferable to interpose a dissimilar metal such as molybdenum (Mo) or chromium (Cr) between aluminum and an ITO, and to cut off the direct contact therebetween. Particularly, Mo cuts off a reaction between aluminum and an ITO and has low contact resistance with both aluminum and ITO.

Further, aluminum or an AlNd alloy containing aluminum and neodymium (Nd) often has a tendency to be oxidized. In a case where a material for forming the second layer 320 is oxidized, there may be concern of oxygen in the oxide diffusing into the aluminum or AlNd alloy. In order to suppress such a phenomenon, a MoNb alloy layer containing a specific quantity of niobium (Nb) is formed on the surface of the second layer 320 as a protective film. This protective layer (MoNb) and the second layer 320 of an AlNd alloy can also be etched at one time by an etching solution consisting of a mixed aqueous solution of phosphoric acid, acetic acid, and nitric acid. In a general light emitting apparatus using an organic EL element, the insulating layer 120 is created by spin-coating a polyimide film which is a material of the insulating layer 120, patterning using a photolithography process, and then heat treating at a temperature of approximately 320° C. It is possible to reduce the resistance of the AlNd alloy of the second layer 320 through this heat treatment. It is considered that this reason is because Nd migrates to the grain boundary of Al due to the heat from the heat treatment.

An opening 122 is formed in the insulating layer 120. The organic EL element 102 is formed using the opening 122. In a case where the light emitting apparatus 10 is a display, a plurality of openings 122 are formed in the conductive layer 300, and a plurality of organic EL elements 102 are formed using the plurality of openings 122. In addition, in a case where the light emitting apparatus 10 is an illumination device, one opening 122 may be formed in the conductive layer 300, and a plurality of openings 122 may be formed in the conductive layer 300. In the latter case, the plurality of organic EL elements 102 are formed using the plurality of openings 122.

As described above, the conductive layer 300 does not include the second layer 320 in the portion overlapped with the edge 126 of the insulating layer 120. The width W of the portion of the conductive layer 300 in which the second layer 320 is not formed is, for example, equal to or greater than 10 μm and equal to or less than 500 μm. In addition, a distance $L_1$ from the edge 126 of the insulating layer 120 to the edge of the second layer 320 located below the insulating layer 120 is, for example, equal to or greater than 5 μm and equal to or less than 250 μm. In addition, a distance $L_2$ from the edge 126 of the insulating layer 120 to the edge of the second layer 320 located outside the insulating layer 120 is, for example, equal to or greater than 5 μm and equal to or less than 250 μm.

Meanwhile, both a portion of the conductive layer 300 which is covered with the insulating layer 120 (excluding the vicinity of the edge 126) and a portion of the conductive layer 300 which is not covered with the insulating layer 120 (excluding the vicinity of the edge 126) have a configuration in which the second layer 320 is laminated on the first layer 310. That is, these two portions have the same layer structure. The structure covering a portion of the conductive layer 300 overlapped with the edge 126 is different from any of the two portions described above.

Next, a method of manufacturing the light emitting apparatus 10 will be described. First, a conductive layer serving as the first electrode 110 is formed on the substrate 100. Next, this conductive layer is selectively removed using etching (for example, dry etching or wet etching) or the like. Thereby, the first electrode 110 and the first layer 310 of the conductive layer 300 are formed on the substrate 100.

Next, a conductive layer serving as the second layer 320 of the conductive layer 300 is formed on the substrate 100, the first electrode 110, and the first layer 310. Next, this conductive layer is selectively removed using etching (for example, dry etching or wet etching) or the like. Thereby, the second layer 320 is formed on the first layer 310. In this case, the second layer 320 is not left in a region of the first layer 310 overlapped with the edge 126 of the insulating layer 120.

Next, an insulating layer is formed on the substrate 100, the first electrode 110, and the conductive layer 300, and this insulating layer is selectively removed using a chemical solution (for example, developing solution). Thereby, the insulating layer 120 and the opening 122 are formed. In a case where the insulating layer 120 is formed of an insulating layer, the insulating layer 120 and the opening 122 are formed by an exposure process and a development process. In a case where the insulating layer 120 is formed of polyimide, heat treatment is further performed on the insulating layer 120. Thereby, the imidization of the insulating layer 120 is advanced.

Next, the organic layer 140 is formed within the opening 122. At least one layer (for example hole, transport layer) constituting the organic layer 140 may be formed using coating such as, for example, spray coating, dispenser coating, ink jetting, or printing. Meanwhile, the remaining layers of the organic layer 140 are formed by, for example, vapor deposition, but these layers may also be formed using a coating method.

Next, the second electrode 150 is formed on the organic layer 140 by, for example, vapor deposition or sputtering.

Figure 4:
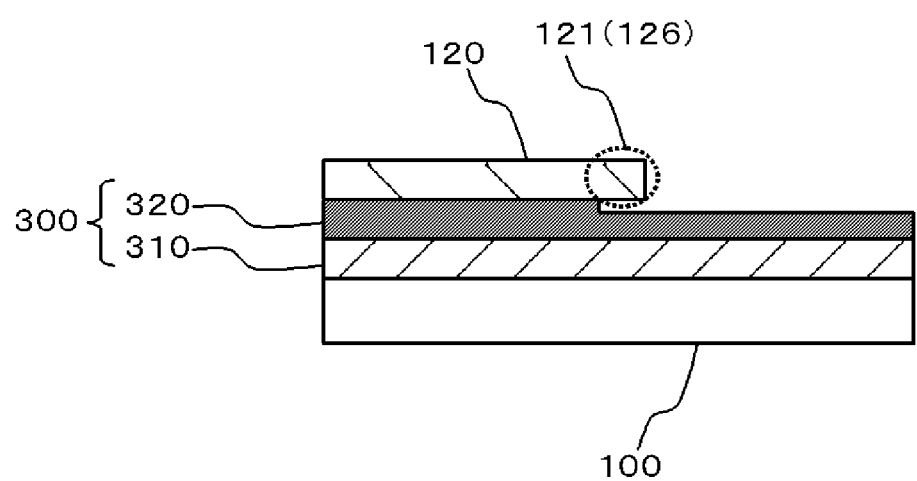
FIG. 4 is a cross-sectional view of a light emitting apparatus according to a comparative example.

FIG. 4 is a cross-sectional view of a light emitting apparatus 10 according to a comparative example, and is equivalent to a cross-section A-A of FIG. 2. In the light emitting apparatus 10 shown in the drawing, the second layer 320 is also formed in the portion overlapped with the edge 126 of the insulating layer 120. In this case, when the insulating layer 120 is selectively removed, a chemical solution penetrates from the interface between the second layer 320 and the insulating layer 120. In addition, a chemical solution also penetrates during a wet process of the next process. For this reason, a portion of the second layer 320 which is located below the edge 126 may become removed. In this case, an overhanging portion 121 is formed on the edge 126 of the insulating layer 120.

Figure 5:
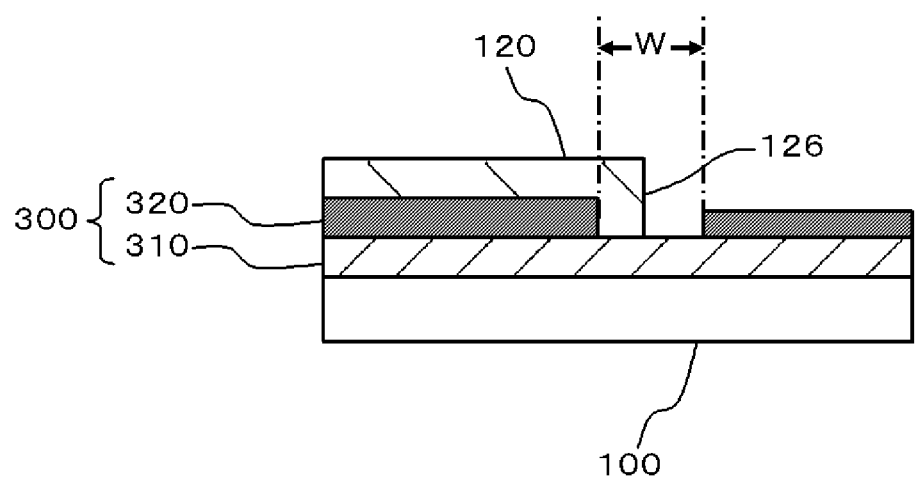
FIG. 5 is a cross-sectional view taken along line A-A of FIG. 2.

FIG. 5 is a cross-sectional view taken along line A-A FIG. 2. As described above, the second layer 320 of the conductive layer 300 is not formed in the portion overlapped with the edge 126 of the insulating layer 120. Therefore, the edge 126 comes into contact with the first layer 310. For this reason, when the insulating layer 120 is selectively removed, and during a subsequent wet process, the second layer 320 does not touch a chemical solution such as an etching solution or a developing solution. Therefore, even in a case where the second layer 320 has a tendency to be etched by this chemical solution, a portion of the second layer 320 which is covered with the insulating layer 120 is not etched.

Therefore, according to the present embodiment, it is possible to prevent the overhanging portion 121 from being formed on the edge 126.

EXAMPLES

Example 1

Figure 6:
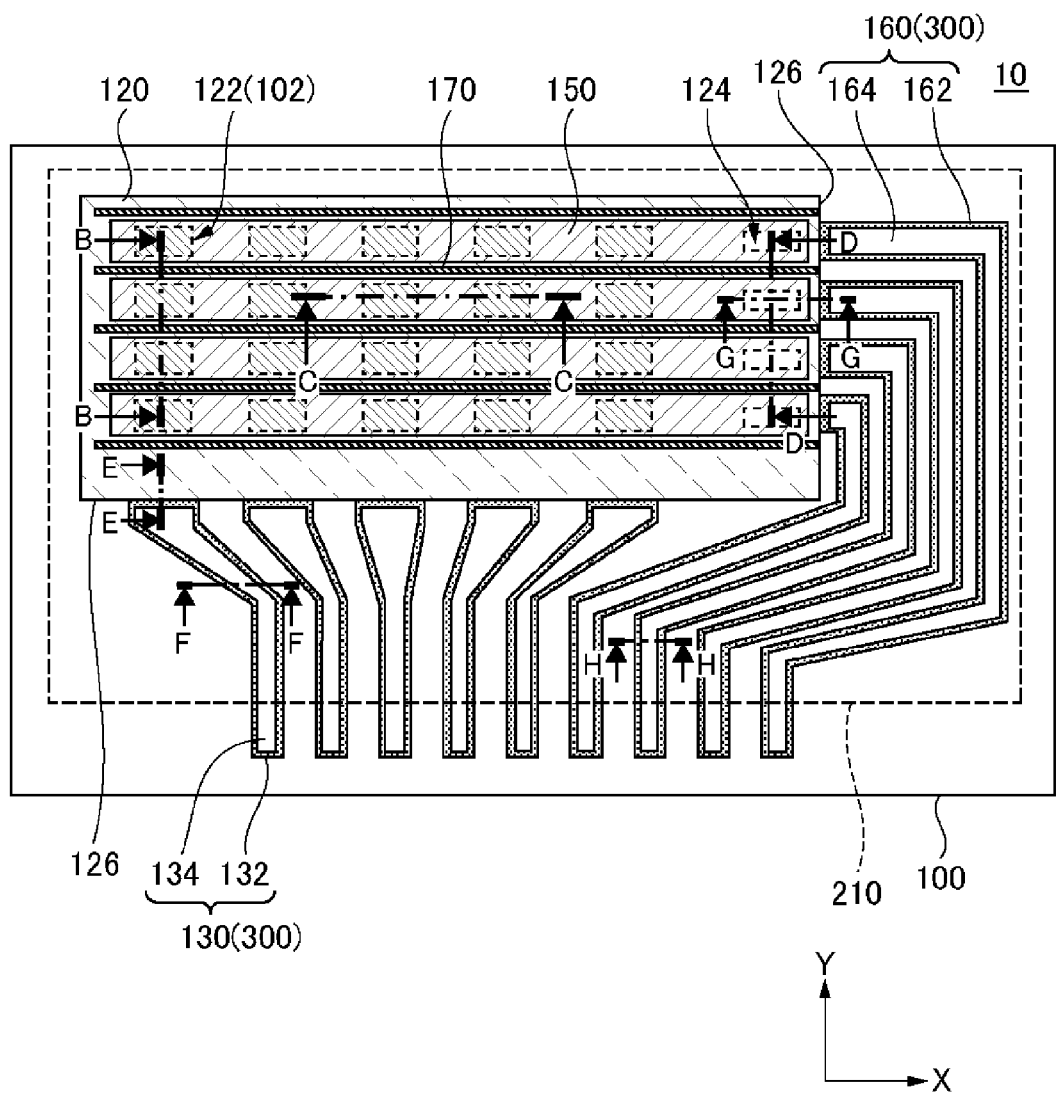
FIG. 6 is a plan view of a light emitting apparatus according to Example 1.
Figure 7:
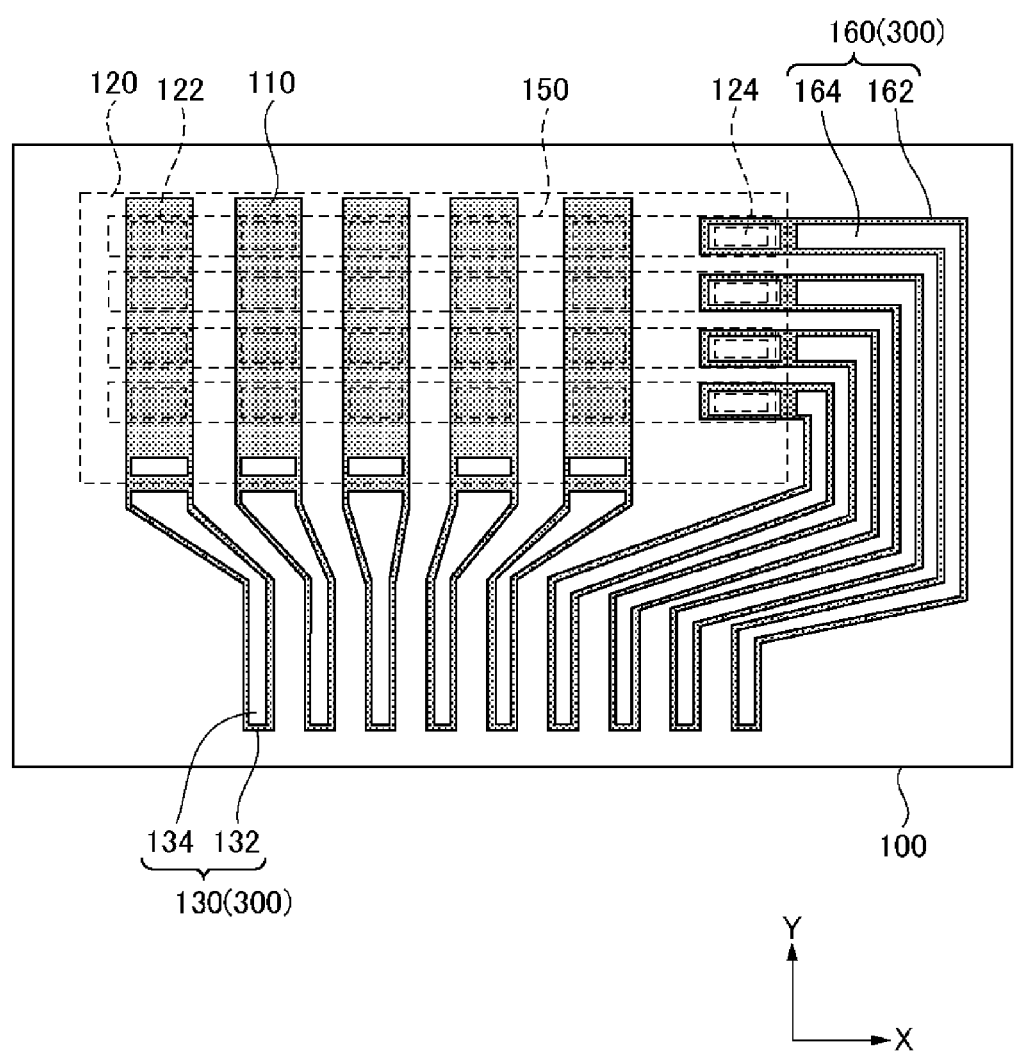
FIG. 7 is a diagram in which a sealing film, a partition wall, a second electrode, an organic layer, and an insulating layer are removed from FIG. 6.
Figure 8:
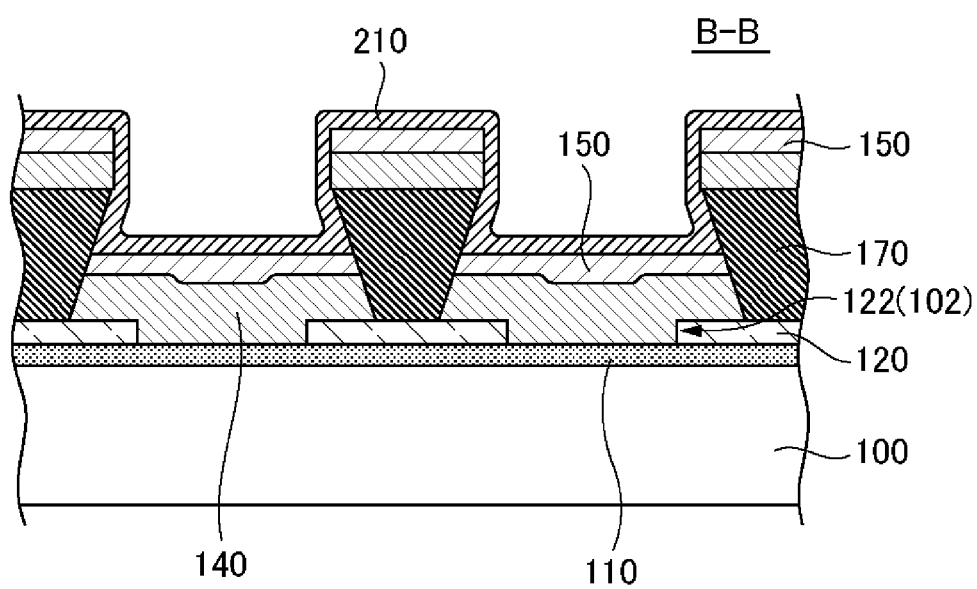
FIG. 8 is a cross-sectional view taken along line B-B of FIG. 6.
Figure 9:
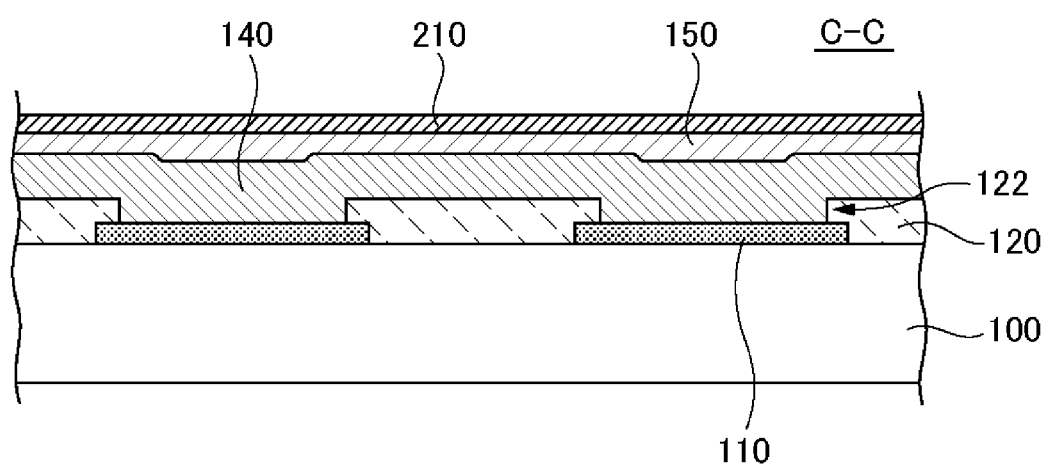
FIG. 9 is a cross-sectional view taken along line C-C FIG. 6.
Figure 10:
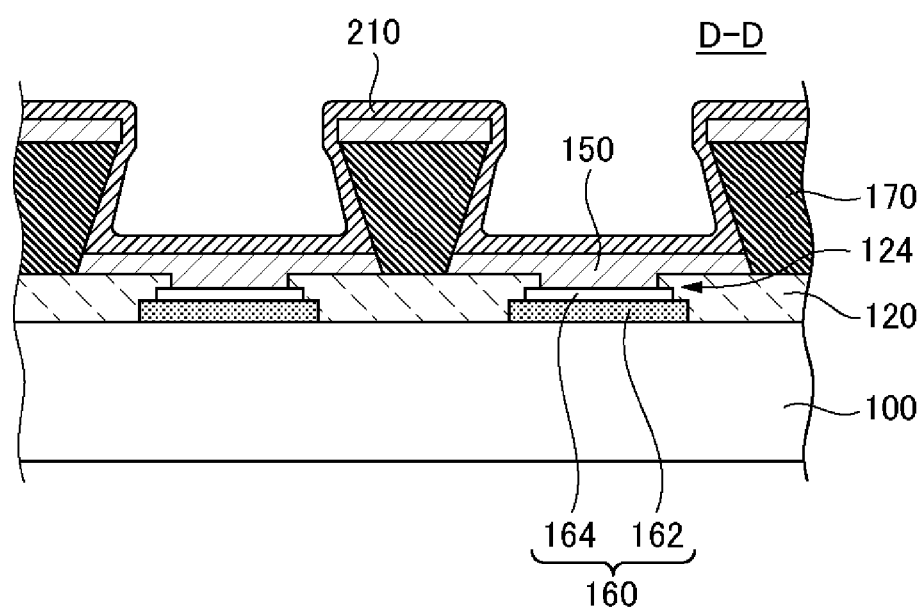
FIG. 10 is a cross-sectional view taken along line D-D of FIG. 6.

FIG. 6 is a plan view of a light emitting apparatus 10 according to Example 1. FIG. 7 is a diagram in which a sealing film 210, a partition wall 170, the second electrode 150, the organic layer 140, and the insulating layer 120 are removed from FIG. 6. FIG. 8 is a cross-sectional view taken along line B-B of FIG. 6, FIG. 9 is a cross-sectional view taken along line C-C of FIG. 6, and FIG. 10 is a cross-sectional view taken along line D-D of FIG. 6. The light emitting apparatus 10 shown in the drawings is used as, for example, a display.

The light emitting apparatus 10 includes the substrate 100, the first electrode 110, the organic EL element 102, the insulating layer 120, a plurality of openings 122, a plurality of openings 124, a plurality of extraction interconnects 130, the organic layer 140, the second electrode 150, a plurality of extraction interconnects 160, and a plurality of partition walls 170. The extraction interconnect 130 and the extraction interconnect 160 are compatible with the conductive layer 300 in the embodiment.

The first electrode 110 is formed on a first surface side of the substrate 100, and linearly extends in a first direction (Y direction in FIG. 6). The first electrode 110 is formed of a light-transmitting material. The first electrode 110 may be a metal thin film which is small in thickness to such an extent that light is transmitted. The end of the first electrode 110 is connected to the extraction interconnect 130.

The extraction interconnect 130 is an interconnect for connecting the first electrode 110 to a terminal. In the example shown in the drawings, one end side of the extraction interconnect 130 is connected to the first electrode 110, and the other end side of the extraction interconnect 130 serves as a terminal. The extraction interconnect 130 has a configuration in which a first layer 132 and a second layer 134 are laminated. The extraction interconnect 130 is an example of the conductive layer 300 in the embodiment. The first layer 132 is compatible with the first layer 310 in the embodiment, and the second layer 134 is compatible with the second layer 320 in the embodiment. In addition, the second layer 134 has a configuration in which a plurality of metal layers are laminated, as described later. Here, the metal layer may be an alloy layer. For example, the metal layer used herein is a Mo layer, an Al layer, an alloy layer of Ni and Mo, or an alloy layer of Mo and Nb. Particularly preferably, the metal layer has a laminated structure of the MoNb alloy layer, the AlNd alloy layer, and the MoNb alloy layer described above. The second layer 134 is formed by laminating a plurality of the metal layers. Meanwhile, the same metal layer may be laminated multiple times.

As shown in FIG. 7, similarly to the embodiment, the second layer 134 (second layer 320) is not formed in a portion of the first layer 132 (first layer 310) overlapped with the edge 126 of the insulating layer 120. In addition, the first layer 132 is formed integrally with the first electrode 110.

As shown in FIG. 6 and FIGS. 8 to 10, the insulating layer 120 is formed on a plurality of first electrodes 110 and in regions therebetween. A plurality of openings 122 and a plurality of openings 124 are formed in the insulating layer 120. A plurality of second electrodes 150 extend in parallel with each other in a direction intersecting the first electrode 110 (for example, an orthogonal direction, which is the X direction in FIG. 6), as described later in detail. The partition wall 170 extends between the plurality of second electrodes 150. The opening 122 is located at a point of intersection between the first electrode 110 and the second electrode 150 when seen in a plan view. The plurality of openings 122 are provided at predetermined intervals. The plurality of openings 122 are aligned in a direction in which the first electrode 110 extends (Y direction in FIG. 6). In addition, the plurality of openings 122 are also aligned in a direction in which the second electrode 150 extends (X direction in FIG. 6). The plurality of openings 122 are thus disposed to constitute a matrix.

The opening 124 is located at one end of each of the plurality of second electrodes 150 when seen in a plan view. In addition, the opening 124 is disposed along one side of the matrix constituted by the openings 122. When seen in a direction along the one side (for example, Y direction in FIG. 6), the openings 124 are disposed at predetermined intervals in a direction along the first electrode 110. A portion of the extraction interconnect 160 is exposed from the opening 124.

The organic layer 140 is formed in a region overlapping the opening 122. A hole transport layer of the organic layer 140 comes into contact with the first electrode 110, and an electron transport layer of the organic layer 140 comes into contact with the second electrode 150. In this manner, the organic layer 140 is interposed between the first electrode 110 and the second electrode 150.

Meanwhile, in the examples shown in FIGS. 8 and 9, a case is shown in which the respective layers constituting the organic layer 140 all protrude to the outside of the opening 122. As shown in FIG. 5, the respective layers constituting the organic layer 140 may or may not be continuously formed between the openings 122 adjacent to each other in a direction in which the partition wall 170 extends. However, as shown in FIG. 10, the organic layer 140 is not formed in the opening 124.

As described above, the organic layer 140 is interposed between the first electrode 110 and the second electrode 150. As shown in FIG. 6 and FIGS. 8 to 10, the second electrode 150 is formed over the organic layer 140, and extends in a second direction (X direction in FIG. 6) intersecting the first direction. The second electrode 150 is electrically connected to the organic layer 140. For example, the second electrode 150 may be formed on the organic layer 140, and may be formed on a conductive layer formed on the organic layer 140. The light emitting apparatus 10 includes a plurality of second electrodes 150 parallel to each other. One second electrode 150 is formed in a direction passing over the plurality of openings 122.

The second electrode 150 is connected to the extraction interconnect 160. In the shown example, the end of the second electrode 150 is located on the opening 124, and thus the second electrode 150 and the extraction interconnect 160 are connected to each other in the opening 124.

The extraction interconnect 160 is an interconnect for connecting the second electrode 150 to a terminal. One end side of the extraction interconnect 160 is located below the opening 124, and the other end side of the extraction interconnect 160 is extracted outside the insulating layer 120. In the example shown in the drawing, the other end side of the extraction interconnect 160 serves as a terminal. The extraction interconnect 160 is an example of the conductive layer 300 in the embodiment, and has a configuration in which a first layer 162 and a second layer 164 are laminated. The first layer 162 is compatible with the first layer 310 in the embodiment, and the second layer 164 is compatible with the second layer 320 in the embodiment. The first layer 162 is formed of the same material as that of the first layer 132, and the second layer 164 is formed of the same material as that of the second layer 134.

As shown in FIG. 7, similarly to the embodiment, the second layer 164 (second layer 320) is not formed in a portion of the first layer 162 (first layer 310) overlapped with the edge 126 of the insulating layer 120.

The partition wall 170 is formed between the adjacent second electrodes 150. The partition wall 170 extends parallel to the second electrode 150, that is, in the second direction. The foundation of the partition wall 170 is, for example, the insulating layer 120. The partition wall 170 is, for example, a photosensitive resin such as a polyimide-based resin, and is formed in a desired pattern by exposure and development. The partition wall 170 is formed using, for example, a negative photosensitive resin. Meanwhile, the partition wall 170 may be formed of resins other than a polyimide-based resin, for example, an epoxy-based resin or an acrylic-based resin, or an inorganic material such as silicon dioxide.

The partition wall 170 is formed in a shape which is trapezoidal in cross-section and is turned upside down (inverted trapezoid). That is, the width of the upper surface of the partition wall 170 is larger than the width of the lower surface of the partition wall 170. For this reason, when the partition wall 170 is formed prior to the second electrode 150, plural second electrodes 150 can be collectively formed by forming the second electrodes 150 on one surface side of the substrate 100 by vapor deposition or sputtering.

In addition, the partition wall 170 also has a function of partitioning the organic layer 140.

The sealing film 210 is formed over the second electrode 150. The sealing film 210 is, for example, an aluminum oxide film, and is formed by, for example, atomic layer deposition (ALD). The thickness of the sealing film 210 is, for example, equal to or greater than 10 nm and equal to or less than 200 nm. As shown in FIGS. 8 to 10, the sealing film 210 covers the insulating layer 120, the extraction interconnect 160, and the extraction interconnect 130. Meanwhile, the sealing film 210 may be formed by film formation other than ALD, for example, by CVD.

Figure 11:
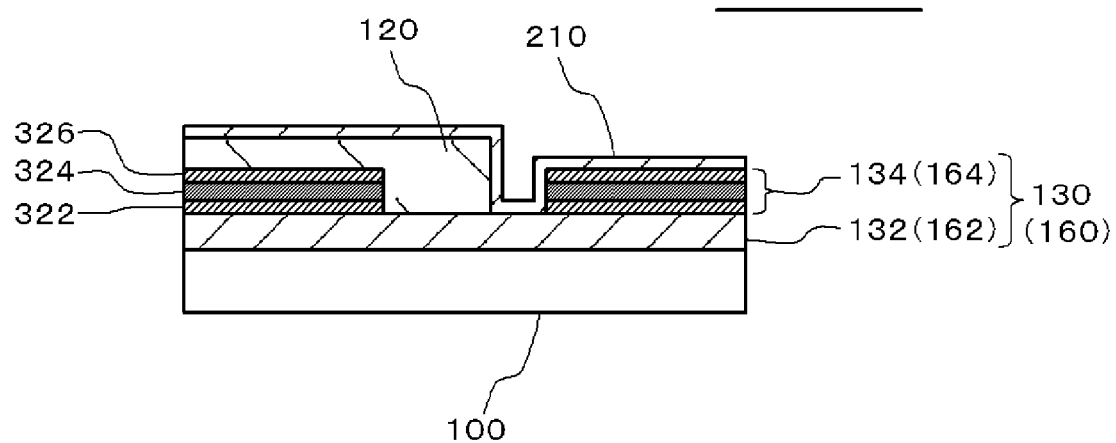
FIG. 11 is a cross-sectional view taken along line E-E of FIG. 6.

FIG. 11 is a cross-sectional view taken along line E-E of FIG. 6. In the example shown in FIG. 11, the sealing film 210 has high step coverage. For this reason, the sealing film 210 continuously covers the end face of the insulating layer 120, the end face of the second layer 134, and also a region of the first layer 132 which is not covered with the insulating layer 120 and the second layer 134.

In addition, the second layer 134 has a configuration in which a protective layer 322, a metal layer 324, and a protective layer 326 are laminated in this order. The protective layer 322 and the protective layer 326 are formed of a material harder and higher in corrosion resistance than that of the metal layer 324, for example, Mo, and the metal layer 324 is formed of, for example, Al.

Meanwhile, a cross-section G-G of FIG. 6 is also the same as the above-described structure.

Next, a method of manufacturing the light emitting apparatus 10 in the present example will be described. First, the first electrode 110, the first layer 132 of the extraction interconnect 130, and the first layer 162 of the extraction interconnect 160 are formed on the substrate 100. A method of forming these elements is the same as that in the embodiment.

Next, a conductive layer serving as the second layer 134 and the second layer 164 is formed over the substrate 100, the first electrode 110, and the first layers 132 and 162, and this conductive layer is selectively removed by wet etching or the like. Thereby, the second layers 134 and 164 are formed. At this time, the second layers 134 and 164 are not left in a region of the first layers 132 and 162 overlapped with the edge 126 of the insulating layer 120.

Next, the insulating layer 120 is formed. A method of forming the insulating layer 120 is the same as that in the embodiment. In this process, a plurality of openings 122 and a plurality of openings 124 are formed.

Next, the partition wall 170 is formed on the insulating layer 120, and the organic layer 140 and the second electrode 150 are further formed thereon. A method of forming these elements is the same as that in the embodiment.

Next, the sealing film 210 is formed by, for example, ALD. Thereafter, a resist pattern is formed on the sealing film 210, and the sealing film 210 is selectively etched (for example, dry-etched or wet-etched) using this resist pattern as a mask. Thereby, a portion of the sealing film 210 which is located on the end of the extraction interconnect 130 and a portion thereof which is located on the end of the extraction interconnect 160 are removed.

Figure 12:
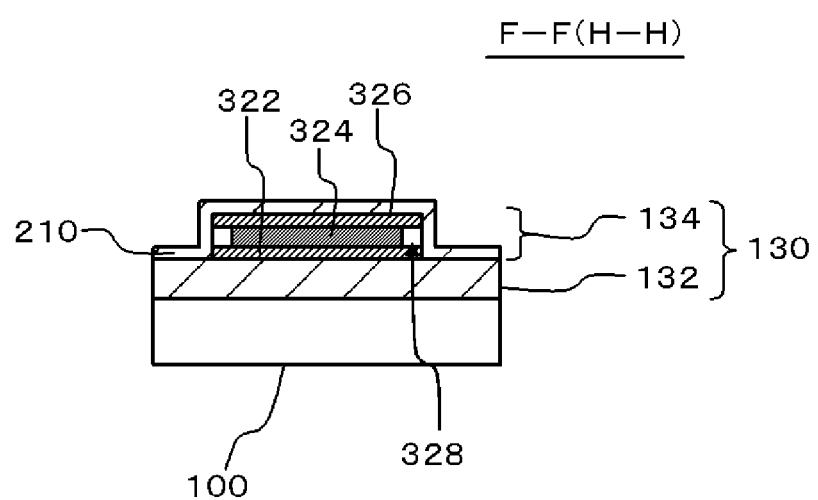
FIG. 12 is a cross-sectional view taken along line F-F of FIG. 6.

FIG. 12 is a cross-sectional view taken along line F-F of FIG. 6. As described above, the second layer 134 has a configuration in which the protective layer 322, the metal layer 324, and the protective layer 326 are laminated. The protective layer 326 is formed of a material having a higher corrosion resistance than that of the metal layer 324. An example is a laminated structure of a MoNb alloy layer formed on the protective layer 322, an AlNd alloy layer formed on the metal layer 324, and a MoNb alloy layer formed on the protective layer 326. The protective films 322 and 326 formed of the MoNb alloy layer and the metal layer 324 formed of the AlNd alloy can be etched at one time by an etching solution consisting of a mixed aqueous solution (chemical solution) of phosphoric acid, acetic acid, and nitric acid. However, the end of the metal layer 324 is etched due to a difference in etching resistance to the chemical solution, and the width of the metal layer 324 becomes smaller than the width of the protective layer 326. For this reason, a cavity 328 is formed below the end of the protective layer 326.

In a case where the second layer 134 is also formed below the edge 126, the cavity 328 is continuously formed up to a portion located below the insulating layer 120. Therefore, there is the possibility of components, such as moisture or oxygen, which deteriorate the organic layer 140 being transmitted to the organic layer 140 through the cavity 328. On the other hand, in the present example, the second layer 134 is partitioned at the portion overlapped with the edge 126. Therefore, since the cavity 328 is also partitioned in the portion overlapped with the edge 126, it is possible to prevent the components which deteriorate the organic layer 140 from being transmitted to the organic layer 140 through the cavity 328.

Figure 17:
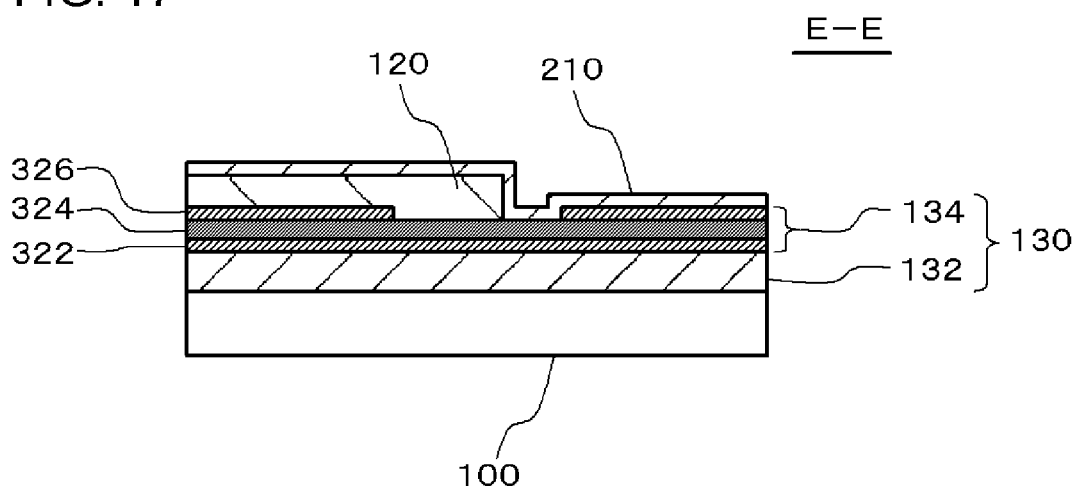
FIG. 17 is a cross-sectional view illustrating a modification example of FIG. 11.

Meanwhile, as shown in FIG. 17, in a region between the second layer 320 and the second layer 134, only the protective layer 326 may be partitioned at the portion overlapped with the edge 126, and the protective layer 322 and the metal layer 324 may remain continuous. In this case also, it is possible to prevent components that deteriorate the organic layer 140 from being transmitted to the organic layer 140 through the cavity 328.

Meanwhile, the same is true of a cross-section H-H of FIG. 6.

In addition, also in the present example, it is possible to prevent the overhanging portion 121 from being formed on the edge 126 of the insulating layer 120.

Example 2

Figure 13:
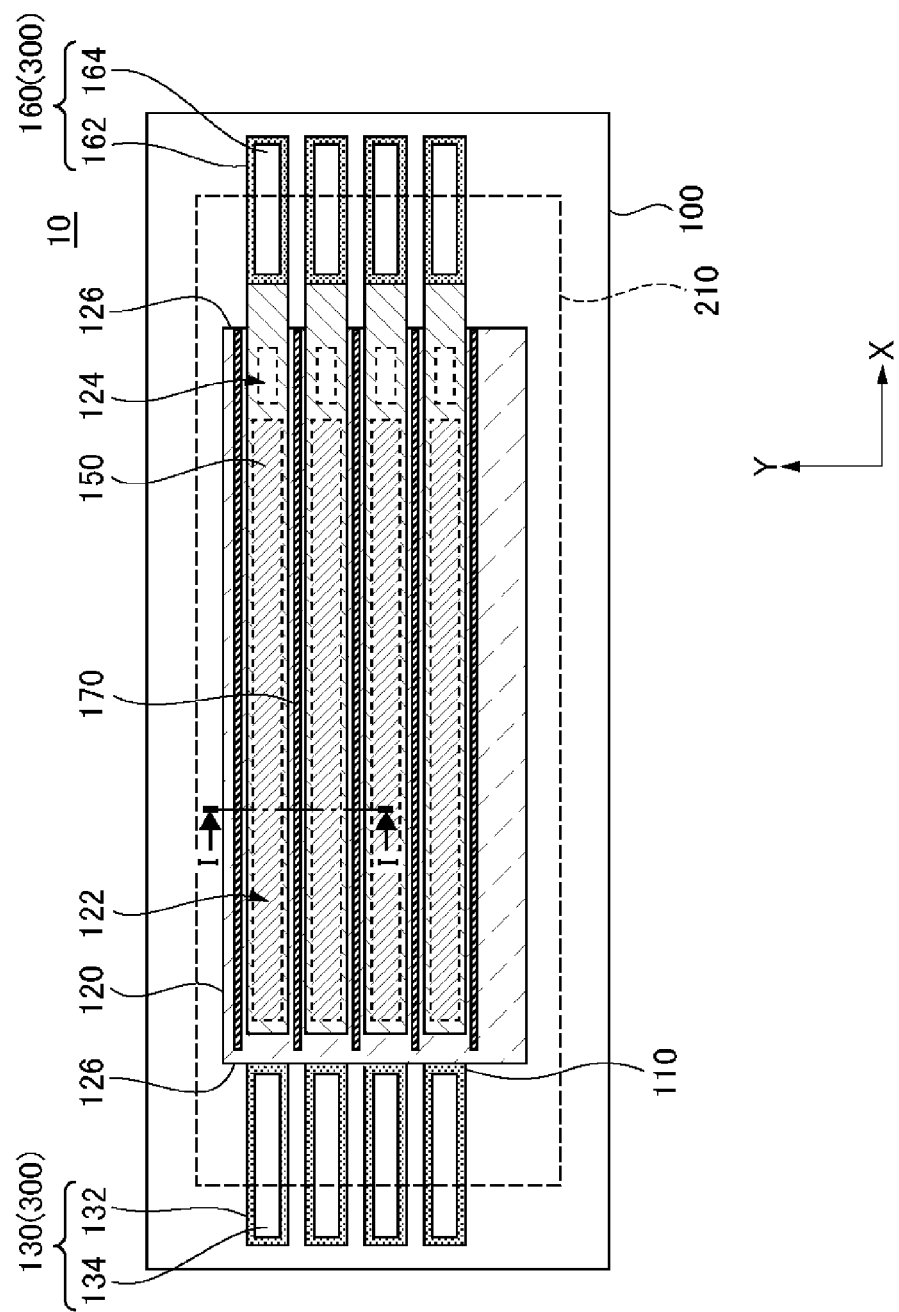
FIG. 13 is a plan view illustrating a configuration of a light emitting apparatus according to Example 2.
Figure 14:
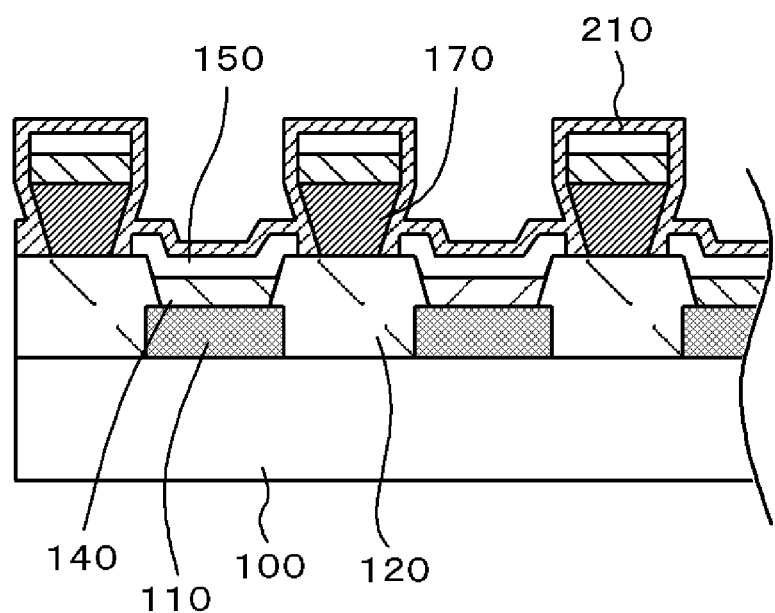
FIG. 14 is a cross-sectional view taken along line I-I of FIG. 13.

FIG. 13 is a plan view illustrating a configuration of a light emitting apparatus 10 according to Example 2. FIG. 14 is a cross-sectional view taken along line I-I of FIG. 13. The light emitting apparatus 10 according to the present example is, for example, an illumination device capable of dimming light, and has the same configuration as that of the light emitting apparatus 10 according to Example 1, except for the following points.

First, one organic EL element 102 is formed between each pair of the adjacent partition walls 170. Specifically, only one opening 122 of the insulating layer 120 is formed between the adjacent partition walls 170. The one opening 122 extends in the same direction as that of the partition wall 170. In addition, the first electrode 110 also extends in the same direction as that of the second electrode 150 between the adjacent partition walls 170. Multiple types of organic EL elements 102 that emit colors (for example, red, green, and blue) different from each other are repeatedly disposed in a direction intersecting the partition wall 170.

In a direction in which the partition wall 170 extends, the extraction interconnect 130 is formed on one end side of the partition wall 170, and the extraction interconnect 160 is formed on the other end side of the partition wall 170. The configurations of the extraction interconnect 130 and the extraction interconnect 160 are the same as those in Example 1.

In the present example, since the cavity 328 shown in Example 1 can also be partitioned at the portion overlapped with the edge 126, it is possible to prevent components that deteriorate the organic layer 140 from being transmitted to the organic layer 140 through the cavity 328. In addition, it is possible to prevent the overhanging portion 121 from being formed on the edge 126 of the insulating layer 120.

Example 3

Figure 15:
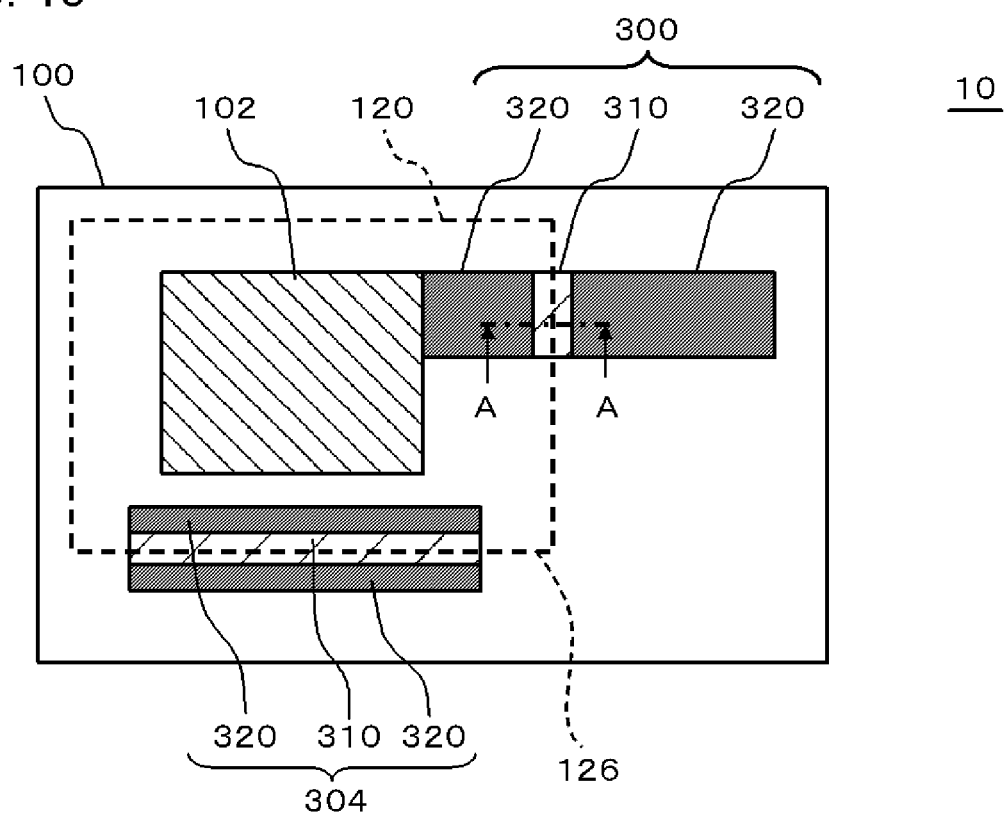
FIG. 15 is a plan view illustrating a configuration of a light emitting apparatus according to Example 3.

FIG. 15 is a plan view illustrating a configuration of a light emitting apparatus 10 according to Example 3. The light emitting apparatus 10 according to the present example has the same configuration as that of the light emitting apparatus 10 according to the embodiment, Example 1, or Example 2, except that the apparatus includes a dummy pattern 304. FIG. 15 shows the same case as that in the embodiment.

The dummy pattern 304 has a configuration in which the first layer 310 and the second layer 320 are laminated. The second layer 320 is not provided in a portion of the dummy pattern 304 overlapped with the edge 126 of the insulating layer 120.

Also in the present example, it is possible to prevent the overhanging portion 121 from being formed in a portion of the edge 126 of the insulating layer 120 overlapping the conductive layer 300. Further, it is possible to prevent the overhanging portion 121 from being formed in a portion of the edge 126 overlapping the dummy pattern 304.

Example 4

Figure 16:
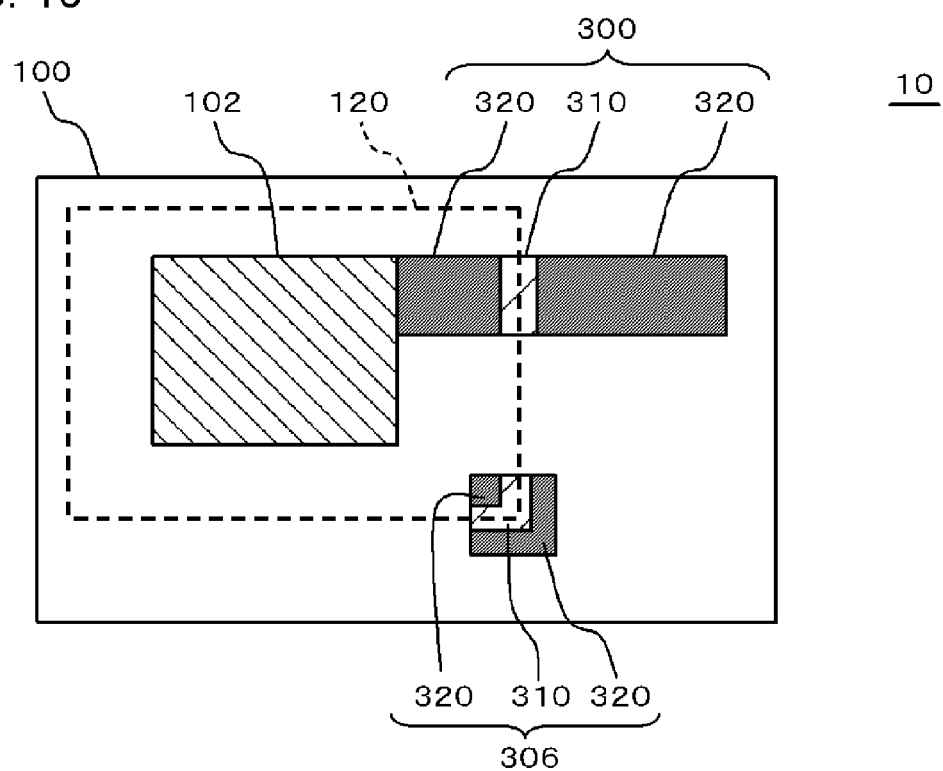
FIG. 16 is a plan view illustrating a configuration of a light emitting apparatus according to Example 4.

FIG. 16 is a plan view illustrating a configuration of a light emitting apparatus 10 according to Example 4. The light emitting apparatus 10 according to the present example has the same configuration as that of the light emitting apparatus 10 according to the embodiment, Example 1, Example 2, or Example 3, except that the apparatus includes an alignment mark 306. FIG. 16 shows the same case as that in the embodiment.

The alignment mark 306 has a configuration in which the first layer 310 and the second layer 320 are laminated. The second layer 320 is not provided in a portion of the alignment mark 306 overlapped with the edge 126 of the insulating layer 120. The alignment mark 306 is used as a positioning mark, for example, when the opening 122 is formed in the insulating layer 120.

Also in the present example, it is possible to prevent the overhanging portion 121 from being formed in a portion of the edge 126 of the insulating layer 120 overlapping the conductive layer 300. Further, it is possible to prevent the overhanging portion 121 from being formed in a portion of the edge 126 overlapping the alignment mark 306.

As described above, although the embodiment and examples have been set forth with reference to the accompanying drawings, they are merely illustrative of the present invention, and various configurations other than those stated above can be adopted.

The invention claimed is:

1. A light emitting apparatus comprising:
    a substrate;
    an organic EL element formed on the substrate;
    an insulating layer that surrounds the organic EL element; and
    a conductive layer located between the substrate and the insulating layer and being across an edge of the insulating layer,
    wherein the conductive layer includes a first layer and a second layer formed over the first layer,
    wherein the second layer includes
        a metal layer, and
        a protective layer formed over the metal layer and composed of a harder material than that of the metal layer, and
    the conductive layer does not include a portion of the second layer in a portion overlapped with the edge of the insulating layer.

2. The light emitting apparatus according to claim 1, wherein a layer structure of a portion of the conductive layer which is covered with the insulating layer is the same as a layer structure of a portion of the conductive layer which is not covered with the insulating layer.

3. The light emitting apparatus according to claim 2, further comprising a terminal formed on the substrate and located further outside than the insulating layer,
    wherein the conductive layer is an interconnect for connecting the organic EL element to the terminal.

4. The light emitting apparatus according to claim 3, wherein the first layer has a light-transmissive property, and
    the second layer is formed of a material having a lower resistance value than that of the first layer.

5. The light emitting apparatus according to claim 1, wherein a layer structure of a portion of the interconnect overlapped with the edge of the insulating layer is different from a layer structure of a portion of the interconnect which is covered with the insulating layer.

* * * * *